(12) United States Patent
Simonin et al.

(10) Patent No.: US 9,299,906 B2
(45) Date of Patent: Mar. 29, 2016

(54) THERMOELECTRIC DEVICE, IN PARTICULAR INTENDED TO GENERATE AN ELECTRIC CURRENT IN A MOTOR VEHICLE

(75) Inventors: Michel Simonin, Voisins le Bretonneux (FR); Stephane Tondelli, Bailly (FR); Georges De Pelsemaeker, Poigny-la-foret (FR)

(73) Assignee: VALEO SYSTEMES THERMIQUES, Le Mesnil Saint Denis (FR)

( * ) Notice: Subject to any disclaimer, the term of this patent is extended or adjusted under 35 U.S.C. 154(b) by 131 days.

(21) Appl. No.: 13/876,742

(22) PCT Filed: Jul. 28, 2011

(86) PCT No.: PCT/EP2011/063025
§ 371 (c)(1),
(2), (4) Date: Oct. 24, 2013

(87) PCT Pub. No.: WO2012/041559
PCT Pub. Date: Apr. 5, 2012

(65) Prior Publication Data
US 2014/0048114 A1 Feb. 20, 2014

(30) Foreign Application Priority Data
Sep. 29, 2010 (FR) ...................................... 10 57876

(51) Int. Cl.
*H01L 35/30* (2006.01)
*F28F 1/32* (2006.01)
(52) U.S. Cl.
CPC .. *H01L 35/30* (2013.01); *F28F 1/32* (2013.01)
(58) Field of Classification Search
CPC .................................. F28F 1/32; H01L 35/30
See application file for complete search history.

(56) References Cited

U.S. PATENT DOCUMENTS

| 4,567,351 A | * | 1/1986 | Kitagawa | ................ F24H 3/004 126/101 |
| 5,584,183 A | | 12/1996 | Wright et al. | |

(Continued)

FOREIGN PATENT DOCUMENTS

| EP | 1515376 A2 | 3/2005 |
| WO | WO 96/11372 A1 | 4/1996 |

(Continued)

OTHER PUBLICATIONS

English language abstract for EP 1515376 extracted from the espacenet.com database on Jun. 7, 2013, 9 pages.

(Continued)

*Primary Examiner* — Golam Mowla
(74) *Attorney, Agent, or Firm* — Howard & Howard Attorneys PLLC (57) ABSTRACT

The invention relates to a thermoelectric device, comprising a first circuit (1), called hot circuit, through which a first fluid can flow according to a path along which the temperature of said first fluid decreases, and, a second circuit (2), called cold circuit, through which a second fluid can flow, at a temperature lower than that of the first fluid, according to a path along which the temperature of said second fluid increases, and elements (3p, 3n), called thermoelectric elements, that can be used to generate an electric current in the presence of a temperature gradient, said thermoelectric elements (3p, 3n) being distributed along said hot (1) and cold (2) circuits, provided configured to create said gradient. According to the invention, the device is configured for the contribution of the thermoelectric elements to the generation of the electricity to be substantially constant along the path of the first and/or of the second fluid.

9 Claims, 4 Drawing Sheets

(56) References Cited

U.S. PATENT DOCUMENTS

| | | | | |
|---|---|---|---|---|
| 2005/0087222 A1* | 4/2005 | Muller-Werth | ............... | 136/224 |
| 2007/0220902 A1 | 9/2007 | Matsuoka et al. | | |
| 2009/0169410 A1* | 7/2009 | Slaton | .................... | B22D 19/00 419/9 |
| 2010/0025013 A1* | 2/2010 | Zha | ....................... | H01L 23/427 165/80.3 |
| 2011/0154811 A1 | 6/2011 | Simonnin | | |

FOREIGN PATENT DOCUMENTS

| | | |
|---|---|---|
| WO | WO 2009/156361 A1 | 12/2009 |
| WO | WO 2012/041558 A1 | 4/2012 |
| WO | WO 2012/041560 A1 | 4/2012 |
| WO | WO 2012/041561 A1 | 4/2012 |
| WO | WO 2012/041562 A1 | 4/2012 |

OTHER PUBLICATIONS

English language abstract for WO 2009/156361 extracted from the espacenet.com database on Jun. 7, 2013, 40 pages.

English language abstract and machine-assisted English translation for WO 2012041560 extracted from the espacenet.com database on Jun. 11, 2013, 42 pages.

English language abstract and machine-assisted English translation for WO 2012041558 extracted from the espacenet.com database on Jun. 10, 2013, 43 pages.

English language abstract and machine-assisted English translation for WO 2012041561 extracted from the espacenet.com database on Jun. 11, 2013, 42 pages.

English language abstract and machine-assisted English translation for WO 2012/041562 extracted from the espacenet.com database on Jun. 11, 2013, 52 pages.

International Search Report for Application No. PCT/EP2011/063021 dated Aug. 17, 2011; 5 pages.

International Search Report for Application No. PCT/EP2011/063025 dated Aug. 29, 2011; 5 pages.

International Search Report for Application No. PCT/EP2011/063026 dated Aug. 17, 2011; 5 pages.

International Search Report for Application No. PCT/EP2011/063029 dated Aug. 29, 2011; 5 pages.

International Search Report for Application No. PCT/EP2011/063033 dated Aug. 29, 2011; 7 pages.

* cited by examiner

THERMOELECTRIC DEVICE, IN PARTICULAR INTENDED TO GENERATE AN ELECTRIC CURRENT IN A MOTOR VEHICLE

RELATED APPLICATIONS

This application is the National Stage of International Patent Application No. PCT/EP2011/063025, filed on Jul. 28, 2011, which claims priority to and all the advantages of French Patent Application No. FR 10/57876, filed on Sep. 29, 2010, the content of which is incorporated herein by reference.

The present invention relates to a thermoelectric device, in particular intended to generate an electrical current in a motor vehicle.

BACKGROUND

Thermoelectric devices have already been proposed that use elements, called thermoelectric elements, that make it possible to generate an electric current in the presence of a temperature gradient between two of their opposing faces by the phenomenon known as Seebeck effect. These devices comprise a stack of first pipes, intended for the circulation of the exhaust gases from an engine, and second pipes, intended for the circulation of a heat-transfer fluid of a cooling circuit. The thermoelectric elements are sandwiched between the pipes so as to be subjected to a temperature gradient originating from the temperature difference between the hot exhaust gases and the cold coolant.

Such devices are of particular interest because they make it possible to produce electricity from a conversion of the heat originating from the engine exhaust gases. They thus offer the possibility of reducing the fuel consumption of the vehicle by replacing, at least partially, the alternator usually provided therein to generate electricity from a belt driven by the crankshaft of the engine.

However, in the known devices, the reduction in the temperature gradient along the pipes poses a problem.

SUMMARY OF THE INVENTION

The invention aims to improve the situation by proposing a thermoelectric device, comprising a first circuit, called hot circuit, through which a first fluid can flow according to a path along which the temperature of said first fluid decreases, and a second circuit, called cold circuit, through which a second fluid can flow, at a temperature lower than that of the first fluid, according to a path along which the temperature of said second fluid increases, and elements, called thermoelectric elements, that can be used to generate an electric current in the presence of a temperature gradient, said thermoelectric elements being distributed along said hot and cold circuits, provided configured to create said gradient.

According to the invention, the device is configured for the contribution of the thermoelectric elements to the generation of electricity to be substantially constant along the path of the first and/or of the second fluid.

In other words, the quantity of heat transmitted to the thermoelements is adapted along the path of the first and/or of the second fluid. In this way, a substantially constant current is generated on the thermoelectric elements, over all of the device.

According to one example, the device according to the invention comprises fins, in a heat exchange relationship with said hot circuit and/or said cold circuit, said fins being configured so as to form a bundle, the thermoelectric elements being in contact at least with said fins.

By associating the thermoelectric elements with fins, the intimacy of the contact between them and the components, hot and/or cold, of the device, with which they have to be in contact in order to be subjected to a temperature gradient, is facilitated. In practice, the need to establish a close link between the thermoelectric elements and the component(s) creating the temperature gradient necessary to their operation is no longer borne by the fluid circulation pipes but by a specific component, the fins, which can therefore be chosen for that, at least for one of said hot or cold circuits. The technical solutions used to establish an effective heat bridge between, on the one hand, the fins and the pipes and, on the other hand, the fins and the thermoelectric elements, will therefore be able to be optimized separately.

According to different exemplary embodiments:
said bundle of fins is configured to allow a substantially constant transmission of heat to the thermoelectric elements,
the density of fins in a heat exchange relationship with said hot circuit and/or said cold circuit increases along the path of the first fluid and/or of the second fluid, According to a first embodiment:
the hot circuit comprises pipes, called hot pipes, for the circulation of the hot fluid,
said cold circuit comprises pipes, called cold pipes, for the circulation of the cold fluid,
said fins, called cold fins, are in a heat exchange relationship with the cold pipes,
the thermoelectric elements are in a heat exchange relationship, on the one hand, with the hot pipes and, on the other hand, with the cold fins.

In this embodiment, it will be possible to provide for:
the density of cold fins to increase along the path of the second fluid,
the material thickness of the cold fins to increase along the path of the first fluid and/or the distance between two consecutive cold fins along the path of the first fluid to decrease along said path.

According to another embodiment:
said hot circuit comprises pipes, called hot pipes, for the circulation of the hot fluid,
said cold circuit comprises pipes, called cold pipes, for the circulation of the cold fluid,
for a first part, said fins, called cold fins, are in a heat exchange relationship with said cold pipes,
for the other part, said fins, called hot fins, are in a heat exchange relationship with said hot pipes,
said thermoelectric elements are provided in a heat exchange relationship, on the one hand, with the cold fins and, on the other hand, with the hot fins.

In this embodiment, it will be possible to provide for:
the density of hot fins to increase along the path of the first fluid,
the material thickness of the hot fins to increase along the path of the first fluid and/or the distance between two consecutive hot fins along the path of the first fluid to decrease along said path.

BRIEF DESCRIPTION OF THE DRAWINGS

The invention will be better understood in light of the following description which is given purely as an indication and which is in no way intended to impose a limitation thereon, accompanied by the attached drawings in which.

DETAILED DESCRIPTION

As illustrated in FIGS. 1 to 4, the invention relates to a thermoelectric device, comprising a first circuit 1, called hot circuit, through which a first fluid can flow, in particular exhaust gases from an engine, and a second circuit 2, called cold circuit, through which a second fluid can flow, in particular a heat transfer fluid of a cooling circuit, at a temperature lower than that of the first fluid.

The device also comprises elements 3, called thermoelectric elements, that make it possible to generate an electric current in the presence of a temperature gradient.

These are, for example, elements of substantially parallelepipedal form generating an electric current, by the Seebeck effect, when they are subjected to said gradient between two of their opposing faces 4a, 4b, called active faces. Such elements make it possible to create an electric current in a load connected between said active faces 4a, 4b. As is known to the person skilled in the art, such elements consists, for example, of bismuth and tellurium ($Bi_2Te_3$).

The thermoelectric elements are, for example, for a first part, elements 3p of a first type, called P, making it possible to establish an electrical potential difference in one direction, called positive, when they are subjected to a given temperature gradient, and, for the other part, elements 3n of a second type, called N, making it possible to create an electrical potential difference in an opposite direction, called negative, when they are subjected to the same temperature gradient.

The hot circuit 1 allows the first fluid to flow according to a path along which the temperature of said first fluid decreases and the cold circuit 2 allows the second fluid to flow according to a path along which the temperature of said second fluid increases. As illustrated, the hot circuit 1 thus comprises one or more inlets 40 and one or more outlets 41. The cold circuit 2 comprises one or more inlets 42, 52 and one or more outlets 43, 53.

Said thermoelectric elements 3p, 3n are distributed along said hot 1 and cold 2 circuits which are configured to create said gradient.

According to the invention, the device is configured for the contribution of the thermoelectric elements to the generation of the electricity 3p, 3n, from said hot 1 and/or cold 2 circuits, to be substantially constant along the path of the first and/or of the second fluid. It is thus possible to have an electric current generated on all of the thermoelectric elements 3p, 3n which is relatively constant, despite the temperature increase and/or decrease undergone by the second and/or, respectively, the first fluid, notably under the effect of the heat exchange with the thermoelectric elements 3, 3p, 3n.

For this, according to a first solution, the exchange surface between the thermoelectric elements and the hot and/or cold circuits can be increased, notably through the number of the thermoelements provided. It will also be possible to adjust the height by providing thermoelements of different heights along the path of the fluid or fluids.

According to another solution, used in the embodiments illustrated, the exchange coefficient is adjusted, that is to say, the characteristics of the device allowing for the heat exchange between the hot 1 and/or cold 2 circuits, on the one hand, and the thermoelements 3p, 3n, on the other hand.

According to this other solution, the thermoelectric elements 3p, 3n will be able to be chosen to be all identical, that is to say, to one another, generating one and the same current under one and the same temperature gradient. Also, the device will be able to have one and the same density of thermoelectric elements 3p, 3n along the hot 1 and/or cold 2 circuits.

Still according to this other solution, the device comprises, for example, fins 5f, 6c, 6f in a heat exchange relationship with said hot circuit and/or said cold circuit. A temperature gradient is thus ensured between said fins or between the fins in a heat exchange relationship with one of said circuits and the other circuit. Said fins 5f, 6c, 6f are also in contact with the thermoelectric elements 3p, 3n on, in particular, their active face 4a, 4b. In other words, the thermoelectric elements are arranged either between two fins, or between one of the fins in a heat exchange relationship with one of the circuits and the other circuit. A current generation by the thermoelectric elements is thus assured.

According to this exemplary implementation, it is therefore the fins 5f, 6c, 6f which fulfill the function of establishing the thermal contact with the thermoelectric elements, at least for one of the circuits.

A fin should be understood to be an element having two large planar opposing surfaces 7a, 7b with a thickness very much less than its width and its length, making it possible to establish a surface contact, for example, between one of said large surfaces 7a and the thermoelectric elements 3p, 3n on their opposing face of faces 4a, 4b to be subjected to a temperature gradient to generate an electric current. The fins 5f, 6c, 6f are formed in a heat-conducting material, in particular a metallic material such as copper or aluminum.

Said fins 5f, 6f, 6c form a bundle and, in this configuration, it will be possible to use the bundles of fins 5f, 6f, 6c to obtain the desired result. In other words, the bundle of fins 5f, 6f, 6c is configured to allow for a substantially constant transmission of heat to the thermoelectric elements 3p, 3n.

For this, for example, the density of fins 5f, 6f, 6c in a heat exchange relationship with said hot circuit 1 and/or said cold circuit 2 increases along the path of the first fluid and/or of the second fluid.

The density of fins should be understood to mean the material thickness of the fins in contact with the hot 1 and/or cold 2 circuits, in particular of their pipes 9, 17, 18 according to the different implementations developed hereinbelow, per linear meter. This way, it will be possible to have their density increased by increasing their thickness and/or by reducing their spacing.

According to an indicative example, it will be possible to provide a ratio between the density of the fins located in proximity to the outlets of the first and/or second fluids 41, 43, 53 to the density of the fins located in proximity to the inlets of the first and/or of the second fluid 40, 42, 52 with a value of between 2 and 5, notably between 3 and 4.

It will be possible in particular to provide a number of groups of fins 5f, 6f, 6c, along the paths of the first and/or of the second fluids, for example three groups, the fins 5f, 6f, 6c being identical in one and the same group and the density of fins increasing from one group to the other along the paths of the first and/or of the second fluid.

The first group, namely the group located in proximity to the inlet of the first and/or of the second fluid has, for example, a first spacing and/or a first thickness, the following group a lesser spacing and/or a greater thickness and so on, the group closest to the outlet of the first and/or of the second fluid having the smallest spacing and/or the greatest thickness.

Some of said fins 5*f*, 6*c*, 6*f* will be able to be associated in pairs, a compressible material 11 being provided between the fins of one and the same pair. It is thus possible to ensure an absorption of the mechanical stress generated by the expansion of the hot and/or cold circuits at the level of said material.

In each pair, the fins 5*f*, 6*c*, 6*f* have, for example, identical dimensions and are arranged parallel to one another, one of the large faces 7*b* of one of the fins 5 being arranged facing one of the large faces 7*b* of the other of the fins of the pair.

In a first embodiment, the fins are coated with an electrically insulating material and are provided, on their face situated facing the thermoelectric elements, with one or more electrically conductive tracks, not represented, linking, in series and/or in parallel, the thermoconductive elements arranged on the fin.

According to another embodiment, the fins 5*f*, 6*c*, 6*f* contribute to the conduction of the electricity produced by the thermoelectric elements 3*p*, 3*n*.

Said compressible material 11 will be able to be electrically insulating, in particular in the embodiment described in the preceding paragraph.

Figure 2:
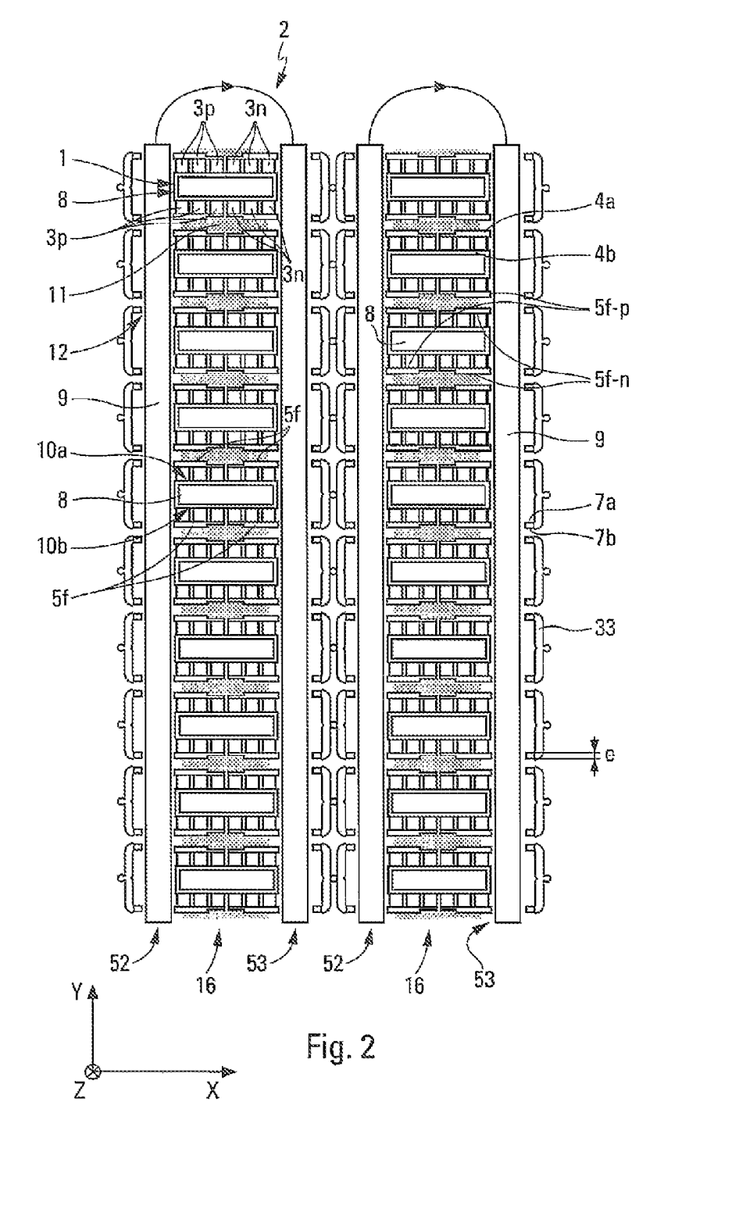

Referring now more specifically to the embodiment of FIG. 2, it will be observed that the hot circuit comprises pipes 8, called hot pipes, for the circulation of the hot fluid. As for the cold circuit, it comprises pipes 9, called cold pipes, for the circulation of the cold fluid. The fins 5*f*, called cold fins, are in a heat exchange relationship with the cold pipes 9. Also, the thermoelectric elements 3*p*, 3*n* are in a heat exchange relationship, on the one hand, with the hot pipes 8 and, on the other hand, with the cold fins 5*f*. Said cold fins 5*f* are grouped in pairs, said compressible material 11 being provided between the fins of one and the same pair.

Said hot pipes 8 are, for example, substantially flat pipes comprising two large parallel opposing faces 10*a*, 10*b*, on which are arranged the thermoelectric elements 3*p*, 3*n* by one of their active faces 4*a*, 4*b*. They are configured to allow for the circulation of exhaust gas and are, in particular, made of stainless steel. They are formed, for example, by profiling, welding and/or hard soldering. They will be able to have a plurality of channels for the passage of the first fluid, separated by separations linking the opposing planar faces of the pipes.

On this subject, the pitch of the baffles will also be able to be adjusted to stabilize the contribution of the thermoelements to the generation of the current.

The hot pipes 8 are coated on said large faces 10*a*, 10*b* with a layer of electrically insulating material and are provided with electrically conductive tracks linking, in series and/or in parallel, all or part of the thermoconductive elements arranged on the hot pipes 8.

The cold fins 5*f* have, for example, orifices 12 for the passage of the cold pipes 9. Said cold pipes are, for example, made of aluminum or of copper and have a round and/or oval section.

The contact between the pipes 9 and the cold fins 5*f* is produced, for example, by an expansion of the material of the pipes as in the heat exchangers known as mechanical exchangers in the field of heat exchangers for motor vehicles. In the embodiments in which the conduction of electricity is produced by the fins, an electrical insulator is provided between the cold pipes 9 and the cold fins 5*f*.

According to the embodiment illustrated, each planar face 10*a*, 10*b* of the hot pipes 8 has associated with it at least two so-called cold fins 5*f-p*, 5*f-n*, called neighboring cold fins, provided facing said planar face and electrically insulated from one another. The thermoelectric elements provided between a first 5*f-p* of said neighboring fins, called P-type fin, and one of said planar faces, are of P-type and the thermoelectric elements provided between the other 5*f-n* of said two fins, called N-type fin, and said planar face are of N type, so as to create a potential difference between said two neighboring fins 5*f-p*, 5*f-n*.

This subassembly consisting of a cold fin 5*f-p*, of one or more P-type thermoelectric elements, of a face 10*a* or 10*b* of the hot pipe 8, of one or more N-type thermoelements and of a cold fin 5*f-n* defines a basic building block which will be able to be reproduced, the building blocks then being assembled electrically in parallel and/or in series in a different way to allow for the generation of a current exhibiting the desired intensity and/or potential difference.

It should be noted that, in this basic building block, as a variant, the cold fin 5*f-p* related to the P-type thermoelectric elements and the cold fin 5*f-n* related to the N-type thermoelectric elements will be able to consist of one and the same cold fin, bearing tracks for conducting the current to avoid any short-circuit between the part of the cold fin related to the P-type thermoelectric elements and the part of the cold fin related to the N-type thermoelectric elements.

There now follows a description of an exemplary embodiment of the arrangement of the thermoelectric elements 3*p*, 3*n* facing a given hot pipe 8 and of the cold fins 5*f* provided to correspond, producing a first assembly of the basic building block described above.

P-Type fins 5*f-p*, respectively N-type 5*f-n*, are located, for example, on either side of one and the same hot pipe 9 and are electrically connected together in such a way, in particular, as to associate in parallel the thermoelectric elements located on either side of the hot pipe 9.

Said hot pipes are superposed in a first direction Y orthogonal to the fins 5*f* in one or more ranks 16, said hot pipes 8 of a rank being arranged between two cold pipes 9. Said cold pipes 9 are oriented in the direction Y of stacking of the hot pipes 8.

The hot pipes 8 of each rank 16 are, for example, provided in the extension of one another from one rank 16 to the other. The thermoelectric elements of the hot pipes 8 located in the extension of one another are, for example, connected in series from one rank 16 to the other. In other words, the fins 5*f-p*, 5*f-n* located on either side of one and the same hot pipe 8, on one side of said pipe, and the fins 5*f-p*, 5*f-n* of the hot pipe 8 located in the extension of the first in the rank of neighboring hot pipes 8 are set to the same potential.

According to this implementation, in which the thermoelectric elements are in contact with the cold fins 5*f* and the hot pipes 8, the density of cold fins 5*f* increases along the path of the second fluid. For this, the material thickness e of the cold fins 5*f* increases along the path of the first fluid and/or the distance between two consecutive cold fins 5*f* along the path of the first fluid decreases along said path.

Here, the thermoelectric elements 3*p*, 3*n* are, for example, distributed in ranks, the thermoelectric elements of one and the same rank extending in the direction Z and a number of ranks parallel to one another being provided. One and the same number of thermoelectric elements is provided for each rank and one and the same number of ranks is provided from one hot pipe 8 to the other along the path of the second fluid.

To refer once again to FIG. 1, according to the embodiment illustrated, said hot circuit comprises pipes 17, called hot pipes, for the circulation of the hot fluid, and said cold circuit comprises pipes 18, called cold pipes, for the circulation of the cold fluid. These are, in particular, round and/or oval pipes, for example made of stainless steel for the hot pipes 17 and of aluminum or of copper for the cold pipes 18.

Figure 1:
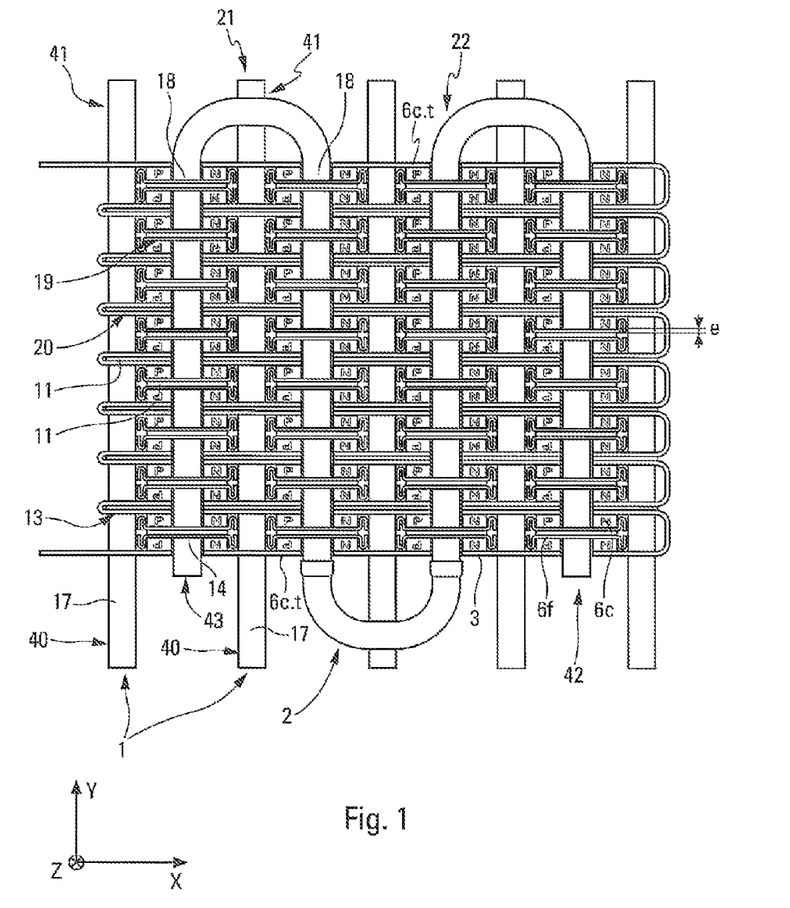
FIG. 1 schematically illustrates a partial cross-sectional view of an exemplary embodiment of the device according to the invention, the cross section being made in a plane orthogonal to the longitudinal axis of the fins, FIG. 2 reprises FIG. 1 in a variant embodiment.

For a first part, said fins 6f, called cold fins, are in a heat exchange relationship with said cold pipes 18 and, for the other part, said fins 6c, called hot fins, are in a heat exchange relationship with said hot pipes 17.

Said thermoelectric elements 3 are configured in a heat exchange relationship, on the one hand, with the cold fins 6f and, on the other hand, with the hot fins 6c.

As in the cold fins 5f of the preceding embodiment, through-orifices 13, 14 are provided for the hot pipes 17, respectively cold pipes 18, in the hot fins 6c, respectively cold fins 6f. The pipe/fin contact is, in particular, of mechanical type, as described above. In the embodiments in which the conduction of electricity is produced by the fins, an electrical insulator is provided between the pipes 17, 18 and the fins 6f, 6c.

According to the embodiment illustrated, said cold pipes 18 and said hot pipes 17 extend in one and the same direction, called Y, and the hot fins and the cold fins are arranged parallel to one another in planes orthogonal to the direction Y, the fins extending in a first direction, called Z, and in a second direction, called X.

In this embodiment, in which the thermoelements are in contact with the cold fins 6f and the hot fins 6c, to obtain the desired result, the density of hot fins 6c, for example, increases along the path of the first fluid. For this, for example, the material thickness of the hot fins 6c increases along the path of the first fluid and/or the distance between two consecutive hot fins 6c along the path of the first fluid decreases along said path.

For its part, the density of fins will be able to be constant along the path of the second fluid.

Here also, the thermoelectric elements 3p, 3n are distributed in ranks, the thermoelectric elements of one and the same rank extending in the direction Z and a number of ranks parallel to one another being provided. One and the same number of thermoelectric elements is provided for each rank and one and the same number of ranks is provided from one hot pipe 8 to the other along the path of the second fluid.

According to an example not represented, three identical groups of fins 6c are provided, a first group, provided in proximity to the inlet of the first fluid, in which the spacing between the fins is of the order of 5 mm, a second intermediary group in which the spacing between the fins is of the order of 3 mm and a final group, provided in proximity to the outlet of the first fluid, in which the spacing between the fins is of the order of 1.5 mm, the fins having, for example, a thickness of the order of a millimeter.

Figure 3:
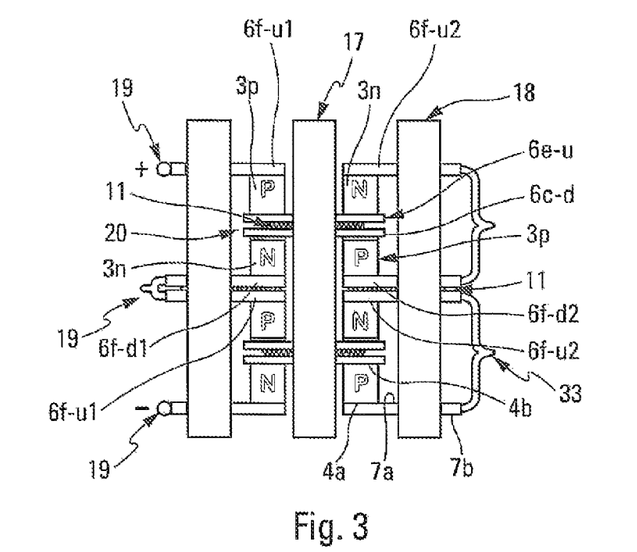
FIG. 3 illustrates a simplified version of the device of FIG. 1, the hot pipes and the cold pipes also being reversed, FIG. 4 reprises FIG. 3 in a variant embodiment.
Figure 5:
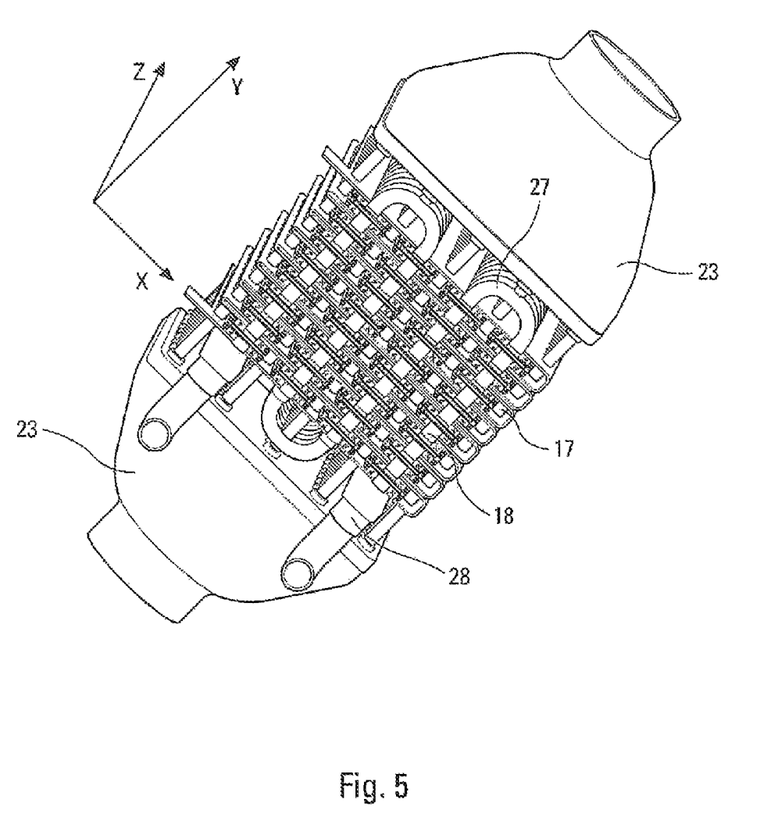
FIG. 5 is a perspective view of the device illustrated in FIG. 1.

According to a first exemplary implementation, corresponding to FIGS. 1, 3 and 5, the cold fins 6f and the hot fins 6c are grouped in pairs, respectively called cold pair 19/hot pair 20, and said compressible material 11 is provided between the fins 6f, 6c of one and the same pair for the cold pairs and the hot pairs.

The hot pairs and the cold pairs are alternated in the direction Y so that at least one so-called cold pair is situated on either side of one so-called hot pair.

At least two cold pairs are provided in the extension of one another in the direction X and electrically insulated from one another, forming a rank of cold fins in the direction X.

As in the preceding embodiment, there is once again here a pattern formed by an assembly of cold fins 6f and of hot fins 6c, separated or not by the compressible material 11, and of thermoelements 3p, 3n. Possible different constructions of this pattern and possible different ways of assembling the patterns will be described hereinbelow, in particular from an electrical point of view.

As detailed in FIG. 3, according to a first exemplary embodiment of said pattern, a first of the hot fins 6c-u of said hot pair 20 is provided facing two cold fins 6f-u1, 6f-u2, of distinct cold pairs, called first and second upstream cold pairs, situated in the extension of one another, on one side of said hot pair 20, the other fin 6c-d of the same hot pair 20 facing two cold fins 6f-d1, 6f-d2 of distinct cold pairs, called first and second downstream cold pairs, situated in the extension of one another, on the other side of said hot pair 20.

One or more P-type elements are provided between the first 6c-u of the hot fins and the fin 6f-u1 of the first upstream cold pairs. One or more N-type elements are provided between said first of the hot fins 6c-u and the cold fin 6f-u2 of the second upstream cold pair.

One or more P-type elements are provided between the other hot fin 6c-d of said hot pair 20 and the cold fin 6f-d2 of the second downstream pair. One or more N-type elements are provided between said other hot fin 6c-d of said hot pair 20 and the cold fin 6f-d1 of the first downstream pair. On either side of the hot pair 20, the upstream P-type elements face downstream N-type elements and the upstream N-type elements face downstream P-type elements.

Referring once again to FIG. 1 in which the hot pipes 17 and the cold pipes 18 are reversed compared to FIG. 3, it will be observed that the device according to the invention will be able to comprise, according to this exemplary implementation, a plurality of hot pairs 20 situated in the extension of one another in the direction X and electrically insulated from one another, so as to form a series of hot pairs in the direction X.

Said hot pairs are also distributed in ranks in which they follow one after the other in the direction Y.

In other words, said series and said ranks of hot pairs follow one another in the directions X and Y.

The cold pairs 19 are also distributed in ranks in which they follow one after the other in the direction Y and/or in series in the direction X. The hot pairs 20 and the cold pairs 19 are, for example, provided in staggered configuration.

The hot pipes 17 are provided, for example, between two ranks of cold pairs 19, in the direction Y, and/or the cold pipes 18 are provided between two ranks of hot pairs 20, in the direction Y.

The succession of hot 20 and/or cold 19 pairs in the direction Y will be able to end on either side, in particular, with a hot fin 6c-t, provided alone, rather than in a pair.

The fins 6c, 6f extend longitudinally in the direction Z and transversally in the direction X and the hot pipes, respectively the cold pipes, are grouped in ranks 21, 22 extending in planes orthogonal to the direction X.

As illustrated in FIG. 5, the device also comprises collecting boxes 23 for the hot fluid into which the hot pipes open by their ends.

The cold pipes and/or the hot pipes are also distributed in ranks extending in planes orthogonal to the direction Z. The cold pipes 18 of one and the same rank orthogonal to Z are linked in pairs by bent ducts 27 linked at their end in such a way as to define a winding circulation of the cold fluid in said rank orthogonal to Z.

The ends of the winding pipes are linked at either end to a collecting box 28 into which they open.

From an electrical point of view, the connections are made by the hot fins in FIG. 1. That said, is also possible to produce them by the cold fins and, in FIG. 3, it will be observed that the pattern described above is assembled as follows. The cold fins 6f-u2 of the second upstream pair of a pattern are connected to the cold fins 6f-u1 of the first upstream pair of the neighboring pattern, in the direction X. The same applies for the downstream cold fins 6f-d2, 6f-d1.

In addition, whether the device comprises one or more hot pairs:

the cold fin 6f-u2 of the second upstream cold pair and the cold fin 6f-d2 of the second downstream cold pair are set to the same potential, for the fins of the cold pairs located at a first end of the series of cold pairs, the cold fin 6f-d1 of the first downstream cold pair of one of the hot pairs is set to the same potential as the cold fin 6f-u1 of said first upstream cold pair of the following hot pair in the direction Y, said cold fins 6f-d2, 6f-u1 forming part of the same pair of cold fins, for the fins of the cold pairs located at the other end of the series of cold pairs.

At the terminals of the hot fins 6c-t, as in FIG. 1, or cold fins, as in FIG. 3, located at the end of the succession of fins in the direction Y, there is thus a potential difference corresponding to the sum of the potential differences created at the terminals of the successive ranks of hot fins, respectively cold fins 6f.

According to a particular exemplary embodiment, the fins of the cold pairs 6f have, along one and/or the other of their longitudinal sides, a folded edge 29 making it possible to thermally insulate the rest of the fin from a heat radiation from the facing hot pipes 17.

Figure 4:
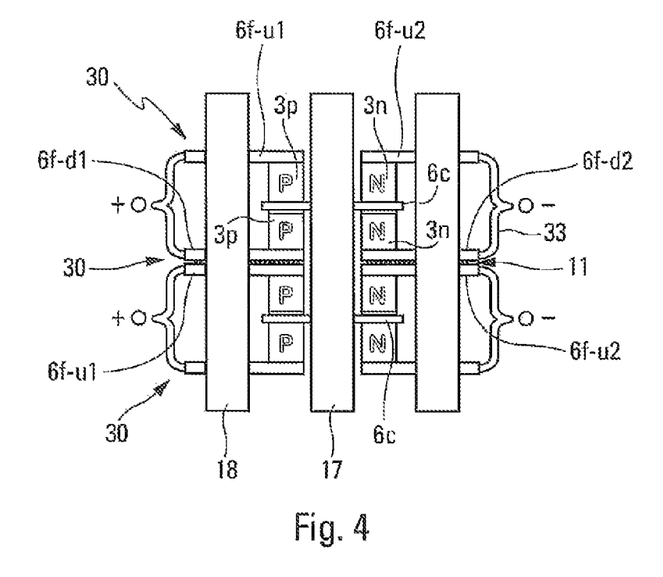

According to another exemplary implementation, corresponding to a different pattern, illustrated in FIG. 4, only the cold fins 6f are grouped in pairs, called cold pairs 30, and said compressible material 11 is provided between the fins of one and the same pair for the cold pairs.

In this exemplary implementation, the cold pairs 30 alternate with the hot fins in the direction Y in such a way that at least one so-called cold pair is situated on either side of one so-called hot fin 6c.

It will possible to provide at least two cold pairs in the extension of one another in the direction X and electrically insulated from one another.

According to the pattern illustrated in FIG. 4, said hot fin 6c is provided, for example, facing two cold fins 6f-u1, 6f-u2, of distinct cold pairs, called first and second upstream cold pairs, situated in the extension of one another, provided on one side of said hot fin, said hot fin 6c also facing two cold fins 6f-d1, 6f-d2, of distinct cold pairs, called first and second downstream cold pairs, situated in the extension of one another, on the other side of said hot fin 6c.

One or more P-type elements are provided between said hot fin 6c and the cold fin 6f-u1 of the first upstream cold pair. One or more N-type elements are provided between said hot fin 6c and the cold fin 6f-u2, of the second upstream cold pair.

One or more N-type elements are provided between the hot fin 6c and the cold fin 6f-d2, of the second downstream cold pair. One or more P-type elements are provided between the hot fin 6c and the cold fin 6f-u1 of the first downstream cold pair. The upstream and downstream P-type elements are situated facing one another on either side of the hot fin 6c. The same applies for the N-type elements.

With this pattern, it will be possible to use the following electrical connections. The cold fin 6f-u2 of the second upstream cold pair and the cold fin of the second downstream cold pair 6f-d2 are electrically connected so as to be at the same potential. The same applies to the cold fin 6f-u1 of the first upstream cold pair and the cold fin 6f-d1 of the first downstream cold pair.

Also, it will be possible to assemble the patterns as follows. The fins 6f-d1, 6f-u1 of the first upstream and downstream cold pairs of one of said hot fins 6c are set to the same potential as those associated with the following hot fins, in the direction Y. The cold fin of the first downstream cold pairs and the cold fin of the first upstream cold pairs associated with two successive hot fins 6c, in the direction Y, form part of the same pair of cold fins. The same applies for the fins 6f-d2, 6f-u2 of the second upstream and downstream cold pairs.

Although this is not represented, it will be possible to provide a bundle using the pattern of FIG. 4, with a number of ranks of hot pipes 17, oriented in the direction Y, each time inserted between two cold pipes 18, these also oriented in the direction Y, the hot and cold fins being oriented orthogonally to the pipes. As for the electrical connections, said ranks will, for example, be mounted in series.

One advantage of the two implementations of FIGS. 3 and 4 is that they make it possible to avoid thermal bridges between the hot components and the cold components, by virtue of the production of subassemblies of hot pipes and of hot fins, and of subassemblies of cold pipes and of cold fins, separated, even though they are interleafed, the only contact between these subassemblies occurring via the thermoelectric elements. In other words, there is an alternation between the P-type and N-type thermoelectric elements, in the direction X.

According to another different exemplary implementation, not represented, the hot pipes and the cold pipes are inserted between one another whereas the hot fins and the cold fins are inserted between one another, in planes at right angles to the pipes, the cold fins and/or the hot fins being optionally distributed in pairs, the fins of one and the same pair being separated by said compressible material.

As in the exemplary implementations of FIGS. 1 and 3 to 5, each cold fin, respectively hot fin, is provided with orifices for the passage of and thermal contact with the cold pipes, respectively hot pipes.

They are also provided with through-orifices without contact of with a thermally and electrically insulating contact with the hot pipes, respectively cold pipes.

Between a cold fin and a hot fin placed facing one another, there is provided thermoelectric elements of the same type. The fins of one and the same pair are set to same electrical potential. The cold fins are successively connected in series. As a variant, the thermoelectric elements situated between two neighboring hot and cold fins are of alternating type, the fins being provided with tracks for the circulation of current to avoid short-circuits between the thermoelectric elements.

In the above, the expressions "electrically connected" or "set to the same potential" should be understood to mean that the fins are connected to one another in the case where it is they which conduct the electricity, or that the tracks provided on the fins are connected together from one fin to the other when the fins are provided with conductive tracks, for example using connection terminals and conventional electrical conductors.

On this subject, it can be noted that producing an electrical connection by the cold fins rather than by the hot fins is advantageous because this does not entail using electrical components rated to withstand high temperatures.

One way of obtaining the device according to the invention comprises a step in which the thermoelectric elements are first assembled with the hot components, hot pipes 8 or hot fins 6c and are then assembled with the cold fins 5f, 6f. The advantage of proceeding successively, in this order, is that it is possible to use relatively severe conditions of execution for the thermoelectric elements/hot components link and less severe conditions for the thermoelectric elements/cold fins link, without the latter risking being damaged by the execution of the thermoelectric elements/hot components link.

The fins are stacked and, in a subsequent step, the cold pipes 9, 18 are assembled in the cold fins 5*f*, 6*f*. The same applies for the hot pipes 17 in the hot fins 6*c* in the embodiments with hot fins.

To ensure the pipes/fins link, as already described above, the pipes 9, 17, 18 in contact with the fins are then subjected, for example, to an expansion. This is, in particular, a radial expansion, obtained by the passage of an expansion olive inside the pipe, resulting in a crimping of the fins 5*f*, 6*f*, 6*c* on the pipes.

A bundle is thus obtained in which the hot pipes 8, 17 and the cold pipes 9, 18 form a framework by virtue of the stress exerted by the fins, once the latter are crimped on the pipes, without the need for clamping tie rods. The pipes are then linked to collecting boxes. The fins are electrically linked together according to the different schemes described above.

The invention claimed is:

1. A thermoelectric device, comprising a first circuit, called hot circuit, through which a first fluid can flow according to a path along which the temperature of said first fluid decreases, and a second circuit, called cold circuit, through which a second fluid can flow, at a temperature lower than that of the first fluid, according to a path along which the temperature of said second fluid increases, and elements, called thermoelectric elements, that can be used to generate an electric current in the presence of a temperature gradient, said thermoelectric elements being distributed along said hot and cold circuits, provided configured to create said gradient, wherein the device is configured for the contribution of the thermoelectric elements to the generation of the electricity to be substantially constant along the path of the first and/or of the second fluid, wherein the density of fins in a heat exchange relationship with said hot circuit and/or said cold circuit increases along the path of the first fluid and/or of the second fluid.

2. The device as claimed in claim 1, comprising said fins being configured so as to form a bundle, the thermoelectric elements being in contact at least with said fins.

3. A thermoelectric device, comprising a first circuit, called hot circuit, through which a first fluid can flow according to a path along which the temperature of said first fluid decreases, and a second circuit, called cold circuit, through which a second fluid can flow, at a temperature lower than that of the first fluid, according to a path along which the temperature of said second fluid increases, and elements, called thermoelectric elements, that can be used to generate an electric current in the presence of a temperature gradient, said thermoelectric elements being distributed along said hot and cold circuits, provided configured to create said gradient, wherein the device is configured for the contribution of the thermoelectric elements to the generation of the electricity to be substantially constant along the path of the first and/or of the second fluid;

fins in a heat exchange relationship with said hot circuit and/or said cold circuit, said fins being configured so as to form a bundle, the thermoelectric elements being in contact at least with said fins;

said bundle of said fins being configured to allow a substantially constant transmission of heat to the thermoelectric elements; and wherein the density of said fins in a heat exchange relationship with said hot circuit and/or said cold circuit increases along the path of the first fluid and/or of the second fluid.

4. The device as claimed in claim 3, in which:
the hot circuit comprises pipes, called hot pipes, for the circulation of the hot fluid,
said cold circuit comprises pipes, called cold pipes, for the circulation of the cold fluid,
said fins, called cold fins, are in a heat exchange relationship with the cold pipes,
the thermoelectric elements are in a heat exchange relationship, on the one hand, with the hot pipes and, on the other hand, with the cold fins.

5. The device as claimed in claim 4, in which the density of cold fins increases along the path of the second fluid.

6. A device in which a material thickness of cold fins increases along the path of a first fluid and/or a distance between two consecutive cold fins along the path of the first fluid decreases along said path.

7. The device as claimed in claim 3, in which:
said hot circuit comprises pipes, called hot pipes, for the circulation of the hot fluid,
said cold circuit comprises pipes, called cold pipes, for the circulation of the cold fluid,
for a first part, said fins, called cold fins, are in a heat exchange relationship with said cold pipes,
for the other part, said fins, called hot fins, are in a heat exchange relationship with said hot pipes,
said thermoelectric elements are provided in a heat exchange relationship, on the one hand, with the cold fins and, on the other hand, with the hot fins.

8. The device as claimed in claim 7, in which the density of hot fins increases along the path of the first fluid.

9. The device as claimed in claim 4, in which the material thickness of the hot fins increases along the path of the first fluid and/or the distance between two consecutive hot fins along the path of the first fluid decreases along said path.

* * * * *